United States Patent
Bertrand et al.

(10) Patent No.: US 6,841,449 B1
(45) Date of Patent: Jan. 11, 2005

(54) TWO-STEP PROCESS FOR NICKEL DEPOSITION

(75) Inventors: Jacques J. Bertrand, Capitola, CA (US); George J. Kluth, Los Gatos, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/061,345

(22) Filed: Feb. 4, 2002

Related U.S. Application Data

(60) Provisional application No. 60/265,629, filed on Feb. 2, 2001.

(51) Int. Cl.[7] .................. H01L 21/336; H01L 21/44
(52) U.S. Cl. .................................. 438/299; 438/655
(58) Field of Search ................ 438/197, 299, 438/655, 664

(56) References Cited

U.S. PATENT DOCUMENTS 6,521,529 B1 * 2/2003 Ngo et al. ............... 438/664

* cited by examiner

*Primary Examiner*—Evan Pert
(74) *Attorney, Agent, or Firm*—McDermott Will & Emery LLP

(57) ABSTRACT

Sub-micron dimensioned, ultra-shallow junction MOS and/or CMOS transistor devices are formed by a salicide process wherein a blanket nickel layer is formed in contact with the exposed portions of the substrate surface adjacent the sidewall spacers, the top surface of the gate electrode, and the sidewall spacers. Embodiments include forming the blanket layer of nickel is formed by the sequential steps of: (i) forming a layer of nickel by sputtering with oxygen gas; and, (ii) forming a layer of nickel by sputtering with argon gas. The two step process for forming the blanket layer of nickel advantageously prevents the formation of nickel silicide on the outer surfaces of the insulative sidewall spacers.

11 Claims, 2 Drawing Sheets

TWO-STEP PROCESS FOR NICKEL DEPOSITION

RELATED APPLICATIONS

This application is based on Provisional Patent Application No. 60/265,629 filed Feb. 2, 2001 and also contains subject matter related to subject matter disclosed in U.S. patent application Ser. No. 10/661,350, filed Feb. 4, 2002, now U.S. Pat. No. 6,632,740, issued Oct. 14, 2003, and U.S. patent application Ser. No. 10/061,348, filed Feb. 4, 2002, now U.S. Pat. No. 6,689,687, issued Feb. 10, 2004.

FIELD OF THE INVENTION

The present invention relates to a method of manufacturing a semiconductor device comprising nickel silicide contacts to source/drain regions. The present invention has particular applicability in manufacturing reliable high density semiconductor devices with submicron design features, shallow junction depths and nickel silicide contacts to source/drain regions.

BACKGROUND ART

Current demands for high density and performance associated with ultra large scale integration require design rules of about 0.18 microns and under, increased transistor and circuit speeds and improved reliability. As device scaling plunges into the deep sub-micron ranges, it becomes increasingly difficult to maintain performance and reliability.

Salicide processing involves deposition of a refractory metal that forms a compound with silicon, but does not react with silicon oxides, nitrides, or oxynitrides under normal processing conditions. Refractory metals commonly employed in the salicide processing include platinum, titanium, nickel, and cobalt, each of which forms very low resistivity phases with silicon, e.g., $PtSi_2$, $TiSi_2$, $Ni_2Si$, and $CoSi_2$.

In practice, the refractory metal is deposited in uniform thickness over all exposed upper surface features of a silicon wafer, preferably by means of physical vapor deposition (PVD). For example, the refractory metal can be sputtered by DC magnetron sputtering in an ultra-high vacuum, multi-chamber system. Tile formation of an MOS transistor requires the formation of a gate structure and source/drain junctions. The gate electrode typically formed by depositing a layer of heavily-doped polysilicon on a metal oxide insulating layer and etching the layers to pattern the electrode. Sidewall spacers are deposited on the opposing side surfaces of the patterned gate electrode. The sidewalls comprise silicon oxide, silicon nitride or silicon oxynitride. The MOS transistor further includes silicon oxide isolation regions formed in the silicon substrate between adjacent active device regions where the source and drain regions are formed or will be subsequently formed.

Generally, in forming the MOS transistor, the refractory metal is deposited after etching the gate electrode and after forming the source/drain junction. In a less common variant, the formation of the source/drain junction is effected subsequent to depositing the refractory metal layer via dopant diffusion through the refractory metal layer into the underlying semiconductor. In either case, after deposition, the refractory metal layer blankets the top surface of the gate electrode. As a result of thermal processing, e.g., a rapid thermal annealing process, performed in an inert atmosphere, the refractory metal reacts with underlying silicon to form electrically conductive silicide layer portions on the top surface of the polysilicon gate electrode and on the exposed surfaces of the substrate where source and drain regions are or will be formed. Unreacted portions of the refractory metal layer, e.g., on the silicon oxide, nitride, or oxynitride sidewall spacers and the silicon oxide isolation regions, are then removed, as by a wet etching process selective to the metal silicide portions.

FIGS. 1(A)–1(E) illustrate the are steps in a typical process in the manufacture of MOS transistors and CMOS devices for forming a nickel silicide layer. Nickel silicide has the advantage in that it possesses the same crystal structure with practically the same dimensions as silicon. Therefore, less mechanical stress will arise in monocrystalline silicon when nickel silicide is formed. In addition, nickel silicide has a great resistance to etchings which are used to etch silicon oxide. As a result, a silicon region having a top layer of nickel silicide may be readily provided with an insulating layer of silicon oxide which can be etched to form at least one contact hole for local contacting the nickel silicide regions.

Referring more particularly to FIG. 1(A), this figure shows a MOS transistor precursor 2. A portion of silicon semiconductor substrate 1 comprises a first conductivity type (p or n). It will be appreciated for P-MOS transistors, substrate 1 is n-type and for N-MOS transistors, substrate 1 is p-type. It is further understood that the substrate may comprise a plurality of n- and p-type regions arrayed in a desired pattern, as, for example, in CMOS devices. Precursor 2 is processed, as by conventional techniques which are not described here in detail, in order not to unnecessarily obscure the primary significance of the following description.

Precursor 2 comprises two isolation regions 3 and 3' of silicon oxide, e.g., shallow trench isolation (STI) regions, extending from the substrate surface 4 to a prescribed depth below the surface. A gate insulator layer 5, typically comprising a silicon oxide layer about 25–50 Å thick, is formed on substrate surface 4. Gate electrode 6, typically of heavily-doped polysilicon, is formed over a portion of silicon oxide gate insulator layer 5, and comprises opposing side surfaces 6' and top surface 6". Blanket layer 7 of an insulative material, typically silicon oxide, silicon nitride, silicon oxynitride or silicon is then formed to cover all exposed portions of substrate surface 5 and the exposed surfaces of the various features formed thereon or therein, inter alia, the opposing side surfaces 6' of gate electrode 6, the top surface 6" of gate electrode 6, and the upper surface of STI regions 3 and 3'. The thickness of blanket insulative layer 7 is selected so as to provide sidewall spacers 7' of desired width on each of the opposing side surfaces 6' of the gate electrode 6.

Referring now to FIG. 1(B), the MOS precursor structure is then subjected to an anisotropic etching process such as by reactive plasma etching utilizing a fluorocarbon- or fluorohydrocarbon-based plasma comprising argon and at least one reactive gaseous species selected from $CF_4$ and $CHF_3$, for selectively removing the laterally extending portions of insulative layer 7 and underlying portions of the gate oxide layer 5, whereby sidewall spacers 7' of desired width profile are formed along the opposing side surfaces 6' of gate electrode 6. According to conventional processing, the entire thickness of the selected portions of insulative layer 7 and any underlying portions of gate oxide layer 5 are removed during the plasma etching process. Endpoint monitoring of the plasma etching process is typically achieved spectroscopically, as by loss of a characteristic oxygen peak of the plasma atmosphere upon complete consumption of the blanket insulative layer 7 and/or the gate oxide layer 5.

In FIG. 1(C), moderately to heavily-doped source and drain junction regions 8 and 9 of conductivity type opposite that of the substrate (or epitaxial layer on a suitable substrate) are formed in substrate 1 by conventional ion implantation (the details of which are omitted for brevity), with sidewall spacers 7' acting as implantation masks and setting the lateral displacement length of moderately to heavily doped regions 8 and 9 from the respective proximal edges of gate electrode 6.

With reference to FIG. 1(D), the thus formed moderately- to heavily-doped source/drain regions 8 and 9 are subjected to a conventional high temperature treatment such as rapid thermal annealing to effect activation and diffusion of the implanted dopant species, thereby also forming lightly-doped, shallower depth source/drain extension regions 8' and 9' laterally extending from the respective proximal edges of the moderately- to heavily-doped source/drain regions 8 and 9 to just beneath the edge of sidewalls 6' of gate electrode 6. It should be recognized, however, that the above-described method for forming source/drain regions including lightly-doped extensions is merely illustrative. Equivalently performing source/drain structures may be formed by alternative process schemes, for example, by first lightly implanting substrate 1 with dopant impurities of second conductivity type before sidewall spacer formation, with the implanted regions extending to just beneath the respective edges of the gate electrode, followed by selective heavy implantation of the lightly-doped implant (e.g., after sidewall spacer formation) to form heavily-doped source/drain regions appropriately spaced from the gate electrode by the lightly-doped (extension) implants.

With continued reference to FIG. 1(D), a blanket layer 10 of nickel is deposited by DC sputtering to cover the exposed upper surfaces of precursor structure 2. Following nickel layer deposition, the device is subject to rapid thermal annealing at a temperature and for a time sufficient to convert nickel layer 10 to electrically conductive nickel silicide where the nickel layer 10 is in contact with the underlying silicon. Any unreacted portions of nickel layer 10 such as those areas over silicon oxide isolation regions 3 and 3' and silicon nitride sidewall spacers 7' would be expected to be totally removed by a wet etch process. However, in the case where the sidewalls are silicon nitride, a very thin layer of nickel silicide 7A' is formed on the outer surface of sidewall spacers 7' as illustrated in FIG. 1(E).

While not wishing to be bound by any particular theory, the present inventors are of the opinion that the thin film of nickel silicide 7A' forms as a result of reaction between the silicon in the nitride sidewall spacers and the nickel layer. Formation of the thin film of nickel silicide 7A' on the outer surface of sidewall spacers 7' disadvantageously results in the fonlation of a conductive bridge to the source, thereby shorting out the transistor.

Thus, there exists a need for an improved methodology for forming self-aligned silicide (i.e., salicide) contacts to ultra-thin transistor source and drain regions which provide greater device reliability and easy compatibility with conventional process flow for the manufacture of MOS-based semiconductor devices, e.g., CMOS devices. Moreover, there exists a need for an improved process for fabricating high quality MOS transistor-based devices which provides increased manufacturing throughput and product yield.

SUMMARY OF THE INVENTION

An object of the present invention is a method of manufacturing a semiconductor device to overcome the aforementioned disadvantage and reduce transistor shorting due to the formation of a thin nickel silicide layer on the spacers.

It is a further object of the invention to provide a two step process for forming the blanket nickel layer before heat treating to form nickel silicide.

It is still a further object of the invention to form a blanket layer of nickel is formed by the sequential steps of: forming a first layer of nickel by sputtering in a oxygen gas atmosphere; and the forming a second layer of nickel on the first layer by sputtering in an argon gas atmosphere, whereby undesirable nickel silicide formation on the sidewall spacers during subsequent processing is substantially eliminated.

Additional objects of the present invention will become readily apparent to those skilled in the art from the following detailed description, wherein only the preferred embodiment of the invention is shown and described, simply by way of illustration of the best mode contemplated for carrying out the invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

The following description of the embodiment of the present invention can best be understood when read in conjunction with the following drawings, in which like reference numeral are employed throughout to designate similar features, wherein.

The figures representing cross-sections of portions of a MOS transistor device during fabrication are not drawn to scale, but instead are drawn as to best illustrate the features of the present invention.

DESCRIPTION OF THE INVENTION

The present invention addresses and solves a problem arising from manufacturing submicron-dimensioned, ultra-shallow junction MOS and CMOS transistors suitable for use in high-density integration semiconductor devices. More specifically, the present invention addresses and solves a problem stemming from the formation of a thin nickel silicide layer on the side wall spacers using conventional methods of manufacture, thus disadvantageously causing shorting out of the transistor because of the formation of a conductive path between the gate and the source. Moreover, the inventive methodology provides increased device reliability while increasing product yield.

The invention is illustrated in FIGS. 2(A)–2(E). The figures show the sequence of processing steps for manufacturing a MOS transistor embodiment of the present invention. However, the methodology illustrated in FIGS. 2(A)–2(E) is not limited to MOS devices. As will be apparent, the inventive process may be readily adapted for use with all manner of semiconductor devices, including CMOS devices.

It should also be recognized that the process steps and structures described below do not necessarily form a complete process flow for manufacturing MOS and/or CMOS transistors for use in integrated circuit (IC) devices. However, the present invention can be practiced in conjunction with conventional IC fabrication techniques and methodologies currently employed in the art, and only so much of the commonly practiced process steps are included here as are necessary for an understanding of the present invention.

The term "semiconductor substrate," as used throughout the present disclosure and claims, means a silicon-containing semiconductor wafer such as a monocrystalline silicon wafer, an epitaxial silicon-containing layer formed on a semiconductor, or a semiconductor layer formed on a suitable non-semiconductor.

Figure 1A:
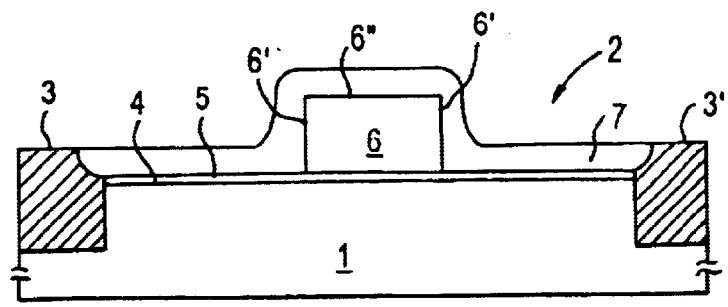
FIGS. 1(A)–1(E) illustrate, in simplified, cross-sectional schematic form, a sequence of steps for forming MOS type transistors utilizing nickel salicide technology according to conventional practices.
Figure 1B:
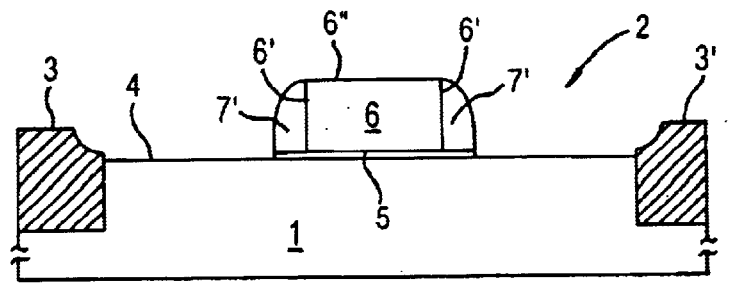
Figure 1C:
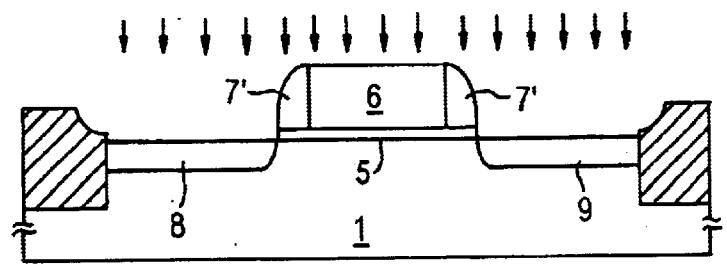
Figure 1D:
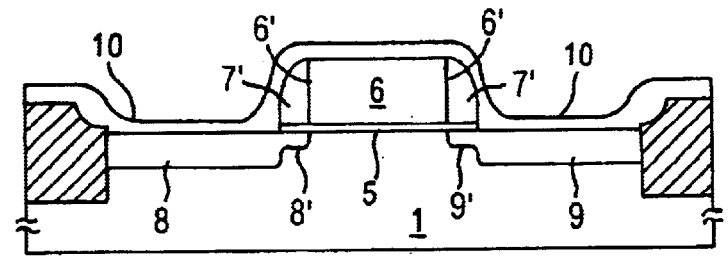
Figure 1E:
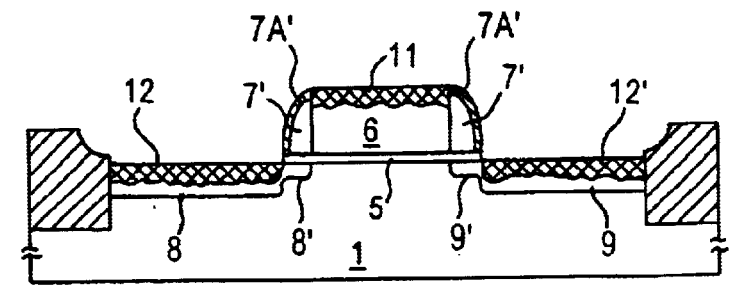
Figure 2A:
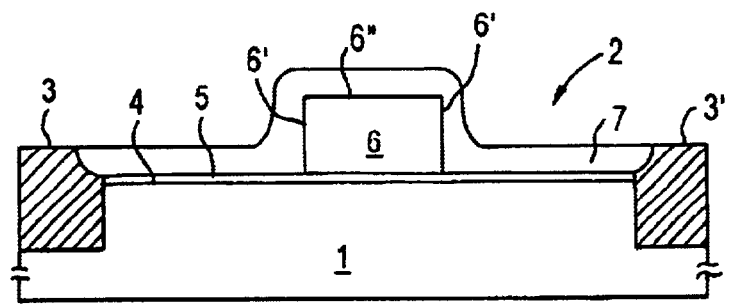
FIGS. 2(A)–2(E) illustrate, in simplified, cross-sectional schematic form, a sequence of steps for forming nickel salicide contacted, shallow-depth MOS type transistors according to the present invention.
Figure 2B:
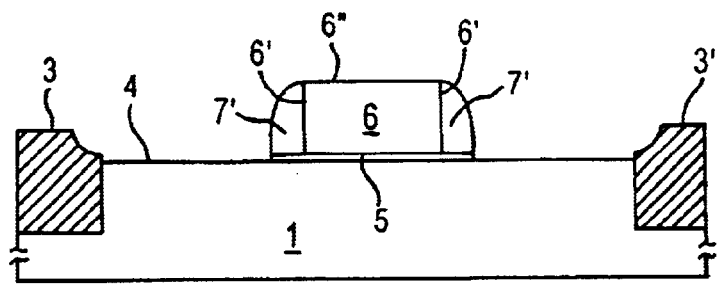
Figure 2C:
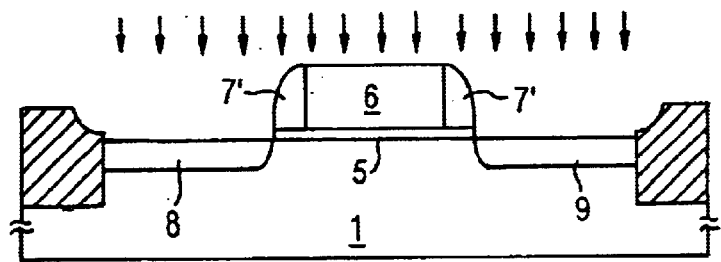
Figure 2D:
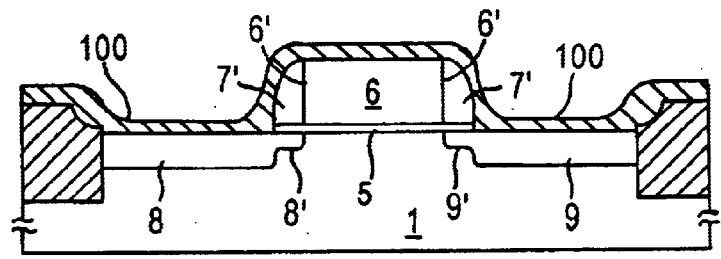
Figure 2E:
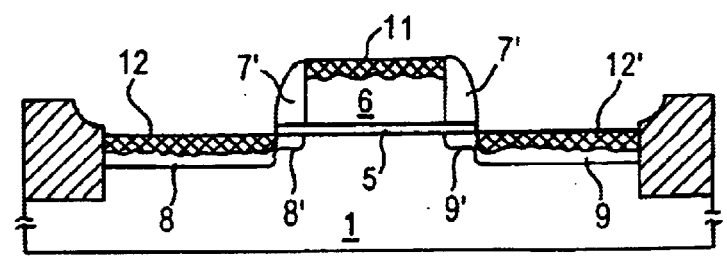

The inventive process illustrated in FIGS. 2(D) and 2(E) is a modification of the process sequence of FIGS. 1(D) and (E) illustrating the conventional art described supra. Accordingly, FIGS. 2(A)–2(C) are identical in all respects to FIGS. 1(A)–1(C) in all respects.

Referring to FIG. 2(D), nickel layer 100 is formed by a two stage sputtering process. process, rather than relying on a single step sputtering process. More specifically, first step of the process comprises deposing the nickel layer to a thickness of from about 25 Å to about 150 Å by sputtering in the presence of oxygen gas. Parameters suitable for oxygen sputtering of nickel for use in the present invention are understandable to those skilled in the art and are not reproduced herein. The second step comprises sputtering nickel in the presence of argon gas. The second sputtering step deposits nickel to a thickness of from about 25 Å to about 150 Å. The parameters suitable for sputtering of nickel in the presence of argon gas for use in the present invention are understandable to those skilled in the art and are not reproduced herein. The nickel layer formed by the first step in the process a property that prevents the diffusion of free silicon from the silicon nitride spacers into the nickel thereby avoiding formation of an undesirable thin nickel silicide layer over the dielectric spacers.

Following the deposition of the nickel layer 10 as described supra, the resultant device is subject to a thermal treatment such as by rapid thermal annealing. The thermal treatment is performed at a temperature and for a time sufficient to convert nickel layer 10 to the corresponding electrically conductive nickel silicide. The nickel silicide forms only where nickel layer 10 is in contact with the underlying silicon. The unreacted portions of nickel layer 10 formed over the silicon oxide isolation regions 3 and 3' and silicon nitride sidewall spacers 7'. The two-stage sputtering process for depositing nickel in accordance with the present invention avoids the formation of a thin layer of nickel silicide on the outer surfaces of the insulative sidewall spacers. As a consequence, MOS-type devices fabricated according to the method of the present invention exhibit improved properties as compared with similar devices obtained via conventional methodology. Further processing may include the conventional steps of, inter alia, forming metal contacts and dielectric insulator layers.

In the previous description, numerous specific details are set forth, such as specific materials, structures, reactants, processes, etc. to provide a better understanding of the present invention. However, the present invention can be practiced without resorting to the details specifically set forth. In other instances, well-known materials and techniques have not been described in order not to unnecessarily obscure the present invention.

What is claimed:

1. A method of manufacturing a semiconductor device, which method comprises the steps of:

(a) providing a semiconductor substrate of a first conductivity type and having a surface;

(b) forming a gate insulator layer in contact with the substrate surface;

(c) forming a gate electrode on a portion of the gate insulator layer, the gate electrode comprising first and second opposing side surfaces and a top surface;

(d) forming a blanket layer of an insulative material on exposed portions of the gate insulator layer on the substrate surface and on the first and second opposing side surfaces and the top surface of the gate electrode;

(e) removing the blanket layer of insulative material from the substrate surface portions and from the top surface of the gate electrode, thereby forming a tapered width insulative sidewall spacer on each of the first and second opposing side surfaces of the gate electrode; and (f) forming a blanket layer of nickel in contact with the exposed portions of the substrate surface adjacent the sidewall spacers, the top surface of the gate electrode, and the sidewall spacers, wherein the blanket layer of nickel is formed by the sequential steps of:

(i) forming a first layer of nickel by sputtering in a oxygen gas atmosphere; and, (ii) forming a second layer of nickel on the first layer by sputtering in an argon gas atmosphere, whereby undesirable nickel silicide formation on the sidewall spacers during subsequent processing is substantially eliminated.

2. The method of claim 1, wherein the layer of nickel formed by sputtering with oxygen gas has a thickness of about 25 Å to about 150 Å.

3. The method of claim 1, wherein the layer of nickel formed by sputtering with argon gas has a thickness of about 25 Å to about 150 Å.

4. The method of claim 1, wherein the blanket layer of nickel has a thickness of about 50 Å to about 300 Å.

5. The method of claim 1, wherein step (a) comprises providing a silicon wafer substrate.

6. The method of claim 1, wherein step (b) comprises forming a silicon oxide gate insulating layer having a thickness of about 25 Å to about 50 Å thick.

7. The method of claim 1, wherein step (c) comprises forming the gate electrode from an electrically conductive material comprising heavily-doped polysilicon.

8. The method of claim 1, wherein step (d) comprises forming a blanket layer of an insulative material comprising a nitride of a preselected thickness for forming the insulative sidewall spacers with a preselected width.

9. The method of claim 1, further comprising the steps of thermally reacting the blanket nickel layer to selectively form an electrically conductive silicide of the nickel at portions thereof in contact with the exposed portions of the silicon substrate surface adjacent the sidewall spacers and the top surface of the polysilicon gate electrode; and selectively removing unreacted portions of the blanket nickel layer, including portions in contact with the sidewall spacers.

10. The method of claim 1, further comprising the steps of forming metal contact and dielectric insulator layers.

11. The method of claim 1, wherein the insulative sidewall spacers comprise an outer surface substantially free of nickel silicide.

* * * * *